(12) United States Patent
Schmit et al.

(10) Patent No.: US 8,339,844 B2
(45) Date of Patent: Dec. 25, 2012

(54) PROGRAMMABLE VIAS FOR STRUCTURED ASICS

(75) Inventors: Herman Schmit, Palo Alto, CA (US); Ronnie Vasishta, Mountain View, CA (US); Adam Levinthal, Redwood City, CA (US); Jonathan Park, San Jose, CA (US)

(73) Assignee: eASIC Corporation, Santa Clara, CA (US)

( * ) Notice: Subject to any disclaimer, the term of this patent is extended or adjusted under 35 U.S.C. 154(b) by 1232 days.

(21) Appl. No.: 12/046,626

(22) Filed: Mar. 12, 2008

(65) Prior Publication Data

US 2008/0224260 A1 Sep. 18, 2008

Related U.S. Application Data

(60) Provisional application No. 60/894,548, filed on Mar. 13, 2007.

(51) Int. Cl.
*H01L 23/525* (2006.01)
*H01L 21/768* (2006.01)

(52) U.S. Cl. ........ 365/163; 257/530; 438/600; 438/467; 438/795

(58) Field of Classification Search .................. 365/163; 257/530, E23.148, E23.147, E21.592, E21.596; 438/600, 467, 795
See application file for complete search history.

(56) References Cited

U.S. PATENT DOCUMENTS

| | | | |
|---|---|---|---|
| 7,058,880 B1* | 6/2006 | Ding et al. | 714/799 |
| 7,254,056 B2* | 8/2007 | Nangle | 365/163 |
| 2005/0181546 A1* | 8/2005 | Madurawe | 438/132 |
| 2009/0072213 A1* | 3/2009 | Elmegreen et al. | 257/2 |

OTHER PUBLICATIONS

Chen et al., "Programmable Via Using Indirectly Heated Phase-Change Switch for Reconfigurable Logic Applications," IEEE Electron Device Letters, vol. 29, No. 1, pp. 131-133, Jan. 2008.

* cited by examiner

*Primary Examiner* — VanThu Nguyen
*Assistant Examiner* — Hai Pham
(74) *Attorney, Agent, or Firm* — Connolly Bove Lodge & Hutz LLP

(57) ABSTRACT

A semiconductor device may be created using multiple metal layers and a layer including programmable vias that may be used to form various patterns of interconnections among segments of metal layers. The programmable vias may be formed of materials whose resistance is changeable between a high-resistance state and a low-resistance state.

15 Claims, 5 Drawing Sheets

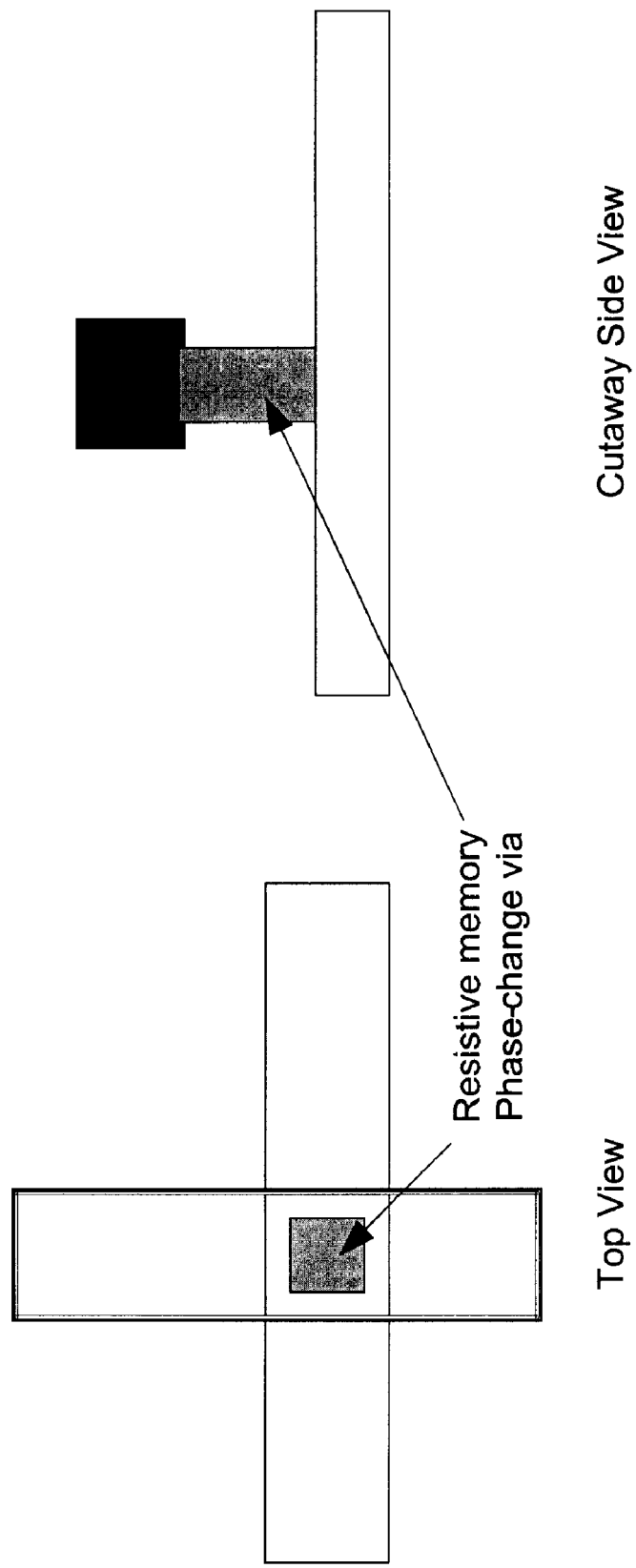

Possible Useful Routing Pattern from Program

Programmed Conductive Vias Shown

Unprogrammed

PROGRAMMABLE VIAS FOR STRUCTURED ASICS

CROSS-REFERENCE TO RELATED APPLICATION

This application claims priority to U.S. Provisional Application No. 60/894,548, filed on Mar. 13, 2007, and incorporated herein by reference in its entirety.

FIELD OF ENDEAVOR

Various embodiments of the invention may involve the general idea of using resistive memory elements based on phase change material or other variable-resistance materials to provide user-customizable integrated circuits.

BACKGROUND

Broadly defined, structured application-specific integrated circuits (ASICs) may attempt to reduce the effort, expense and risk of producing application-specific integrated circuits (ASIC) by standardizing portions of the physical implementation across multiple products. By amortizing the expensive mask layers of the device across a large set of different designs, the non-recurring engineering (NRE) seen by a particular customer for a customized ASIC can be significantly reduced. There may be additional benefits to the standardization of some portion of mask set, which may include improved yield through higher regularity and/or reduced manufacturing time from tape-out to packaged chip.

Compared to a field-programmable gate array (FPGA), the unit price of a structured ASIC solution may be reduced by an order of magnitude due to the removal of the storage and logic required for configuration storage and implementation. The unit cost of a structured ASIC may be somewhat higher than a full custom ASIC, primarily due to the imperfect fit between design requirements and a standardized base layer, with certain I/O, memory and logic capacities.

Structured ASIC products may be differentiated by the point at which the user customization occurs and how that customization is actually implemented. Most structured ASICs may only standardize transistors and the lowest levels of metal. A large set of metal and via masks may be needed in order to customize a product. This yields a marginal cost reduction for NRE. Manufacturing latency and yield benefits may also be compromised using this approach.

In some prior patents, all but one via layer in the mask set may be standardized. This single via layer may be implemented, for example, using one of at least two approaches:

A prototyping flow using direct-write e-beam technology may be used to eliminate the need for any mask layers.

A production flow may use a mask layer for the vias.

The disadvantage of structured ASICs compared to FPGAs is that FPGAs do not require any user design information during manufacturing. Therefore, FPGA parts can be manufactured in larger volumes and can exist in larger inventories. This allows the latency of getting parts to customers in the right volumes to be reduced. FPGAs can also be modified after their initial configuration, which means that design bugs can be removed without requiring a fabrication cycle. Design improvements can be made in the field, and even done remotely, which removes the requirement of a technician to physically interact with the system.

An ideal ASIC device may combine the field programmability of FPGAs with the power and size efficiency of ASICs or structured ASICs.

Phase change memory materials may be used to store information reaching one of two physical phases: either an amorphous phase that may have high resistivity or a crystalline phase that may have low resistivity (while this is a typical way in which phase change memory materials work, the further possibility is envisioned of an atypical phase change memory material that may work in the opposite fashion or in some other fashion, and which may still be utilized in embodiments of the invention). One of the materials that may be used is chalcogenide. This material is often used, for example, in CD-RW and DVD-RW technology, where the phase change is performed by heating and cooling with a laser beam. It is also possible to change the state with an electric current. A high current may be used to create a higher temperature, and the material may then cool to the amorphous phase with a higher resistance. A medium current may be used to change the cooling to the crystalline phase with a lower resistance. A low current can be used to sense the resistance of the material without changing the phase of the material. This technology is patented and licensed by a company called Ovonyx.

There are other phase-change materials, such as oxide-based solid electrolytes. Memories using such technologies are sometimes referred to as Programmable Metallization Cells (PMCs).

A combination of resistive memory technology and via-configured structured ASICs can be used to offer an improved customizable integrated circuit, with low cost, area, and power of the structured ASIC, and the field programmability of an FPGA.

SUMMARY OF EMBODIMENTS OF THE INVENTION

In an embodiment of the invention, the material that may be used for construction of a programmable via may have very high, or nearly infinite, resistance in one phase, and nearly zero resistance in the other phase (to accurately model a via). The scale of the phase change material may be fabricated to match the scale of the rest of the fabricated circuit (i.e., to be no larger than a via). Finally, a phase-change programmable via may be electrically programmable. In some embodiments, such programming may be done in-system and/or without extraordinarily high voltage or extreme temperature and/or without significant circuit overhead.

In a further embodiment of the invention, the phase-change material may be replaced with an alternative material whose resistance may be varied between a high-resistance state and a low-resistance state.

BRIEF DESCRIPTION OF THE DRAWINGS

Various embodiments of the invention will now be described, with reference to the accompanying drawings, in which:

FIGS. 1A and 1B show views of an exemplary via according to an embodiment of the invention;

DETAILED DESCRIPTION OF VARIOUS EMBODIMENTS OF THE INVENTION

FIGS. 1A and 1B show an example of a programmable via, according to an embodiment of the invention, in top-view and cutaway view, respectively. In FIGS. 1A and 1B, the phase change material is shown as being sandwiched between two metal layers, as a via may be in a via-programmed structured ASIC. The material, when it is resistive, may be used to essentially electrically isolate the two wires. When the material is conductive, it may be used to allow signals transmitted as either voltage or current changes.

Figure 2C:
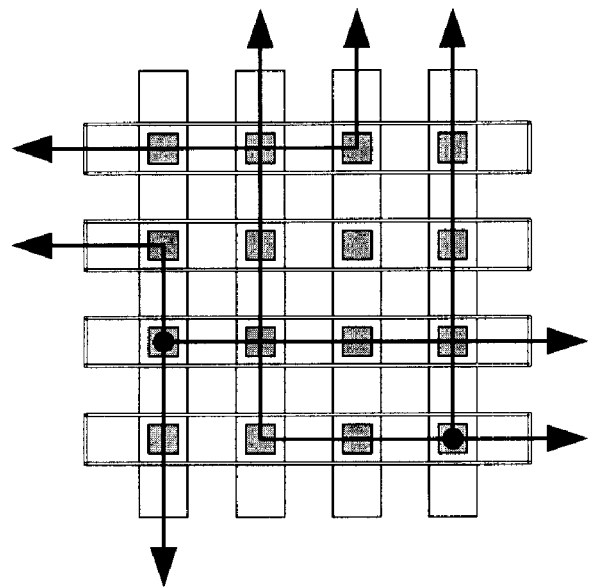
FIGS. 2A-2C show an exemplary metal array with programmable vias and ways in which they may be programmed and/or used according to various embodiments of the invention.
Figure 2B:
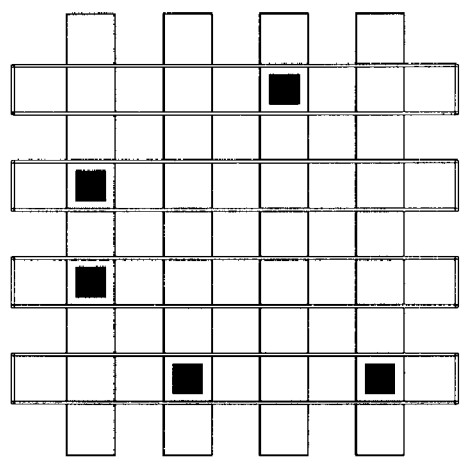
Figure 2A:
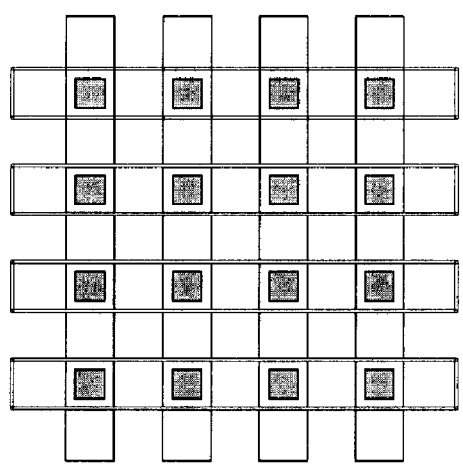

The arrangement of wires and phase change programmable vias in an array, as shown in the example of FIGS. 2A-2C, may be used to provide for a high number of user routing requirements, in various embodiments of the invention. FIG. 2A shows an example of an array with programmable via points at all overlapping points between two wires. FIG. 2B illustrates a particular programming of those vias, with the conductive vias shown as darkened areas and the resistive vias removed. FIG. 2C illustrates one possible usage of this configuration for a particular example of a set of programmable connections. While the examples shown in FIGS. 2A-2C are described for a case in which all of the vias shown in FIG. 2A are programmable, it should be noted that it is also possible to provide a via layer in which some of the vias are non-programmable and some are programmable. In such case, the result shown in FIG. 2B may result from a combination programming some of the programmable vias, in combination with the existing non-programmable vias.

Figure 3:
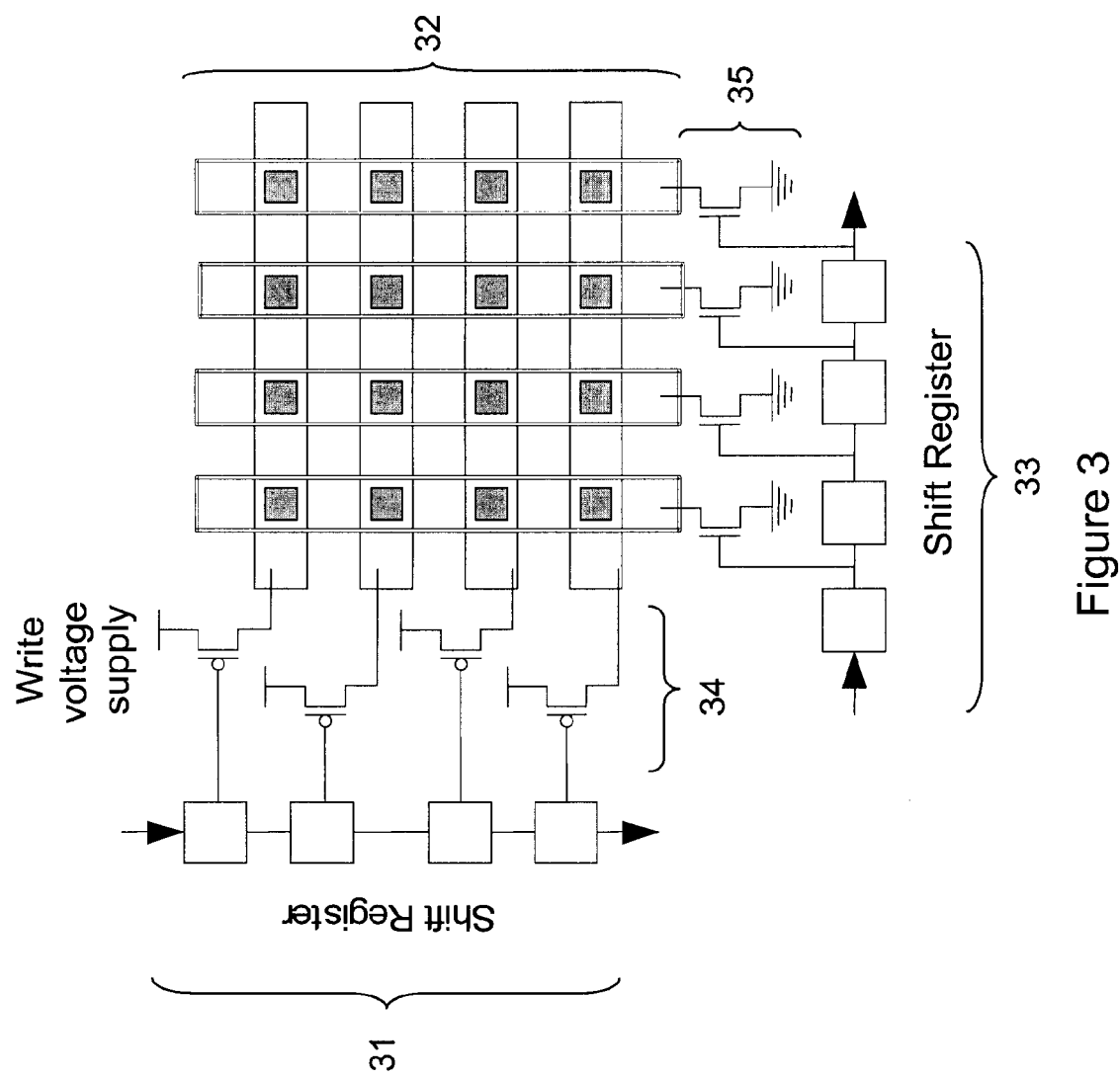
FIG. 3 shows a diagram of a system that may be used to program a programmable via array according to various embodiments of the invention.

FIG. 3 illustrates an exemplary possible programming structure for the array 32 of phase-change programmable vias, which may correspond to the array shown in FIGS. 2A-2C. This exemplary structure may include PMOS and/or NMOS transistors (34, 35) that may be used to provide large or small write voltages across one or more of the various vias. Shift registers 31 and 33 may be used to provide write patterns to each of the vertical and horizontal segments. Multiple vias may be written at the same time by turning on the appropriate rows and/or columns. These structures (the transistors to provide the voltage and the shift registers) may be disabled after programming. They may minimally load the user circuit.

While ideally, the materials to be used for the vias may exhibit such behaviors as discussed above, many real materials generally do not exhibit such behaviors. In addition, the current primary uses of these technologies are more typically found in non-volatile memories, which have a different set of ideal characteristics. In particular, an ideal memory cell built from this technology may allow write operations to happen quickly and with low energy. Furthermore, the difference between resistive and conductive phases is generally not as important to memories, as a memory merely has to differentiate one state from another. A high difference between resistive and conductive phases may actually be a problem in frequently changing memory applications, as a low resistance would make it difficult to create adequate heat for the phase change. Used as a programmable via, the required energy to change phase may be high; the time to change the phase may be longer; and the performance cost of high resistance for conductive vias may be significant.

Therefore, circuit techniques and programming techniques may be used to address the non-ideal nature of these materials.

At least three techniques may be used to address various programming-related issues:
1) Laser beams may be used to change the state.
2) The temperature of the material may be changed during programming. With a material that requires much higher energy than a typical operating temperature to change the state, the temperature during programming may be raised above operating temperature in order to lower the energy level required for programming.
3) Lower voltage may be used for signal transfer through programmable interconnects. That is, one may ensure that the voltage across programmable connections is less than the programming voltage.

Each of these techniques will now be discussed in further detail.

With laser beams, a challenge may exist in that the sandwich of a via between metal layers may make it difficult for the energy of a laser beam to heat the via material sufficiently. To address this, there are at least two techniques that may be used:
  a) Use an offset angle to get energy into a via location.
  b) Use multiple focused beams to get energy into a via location.

Regarding temperature change, one may raise the temperature to near the melting temperature of the material and program it at a voltage associated with the raised temperature, which may be less than the programming voltage needed at lower temperatures.

Finally, during operation, one may use lower signal voltage on signals to avoid the voltage across the via terminals creating enough heat to melt the device (and thus possibly cause inadvertent re-programming).

Regarding the other problem noted above, the finite resistance problem, there are also techniques that may be used to address this. In particular, the inventors are aware of at least three techniques that may be used to address the finite resistance of typical phase change materials in their resistive phase, when used to create programmable vias:
1) One may limit the number of vias connected to any one segment, and a buffer may be inserted periodically. This may result in adequate noise margin regardless of how many resistive vias are connected to the segment.
2) One may connect a pair of resistive vias to either GND or VDD, and then to the gate of a diffusion transistor, which may be used as a pass transistor, to pass a value through the pass transistor.
3) One may connect a pair of resistive vias to either GND or VDD, and then connect it to the gate of a pair of diffusion transistors, which may be used to enable or disable a buffer.

These techniques will now be discussed in further detail.

Figure 4B:
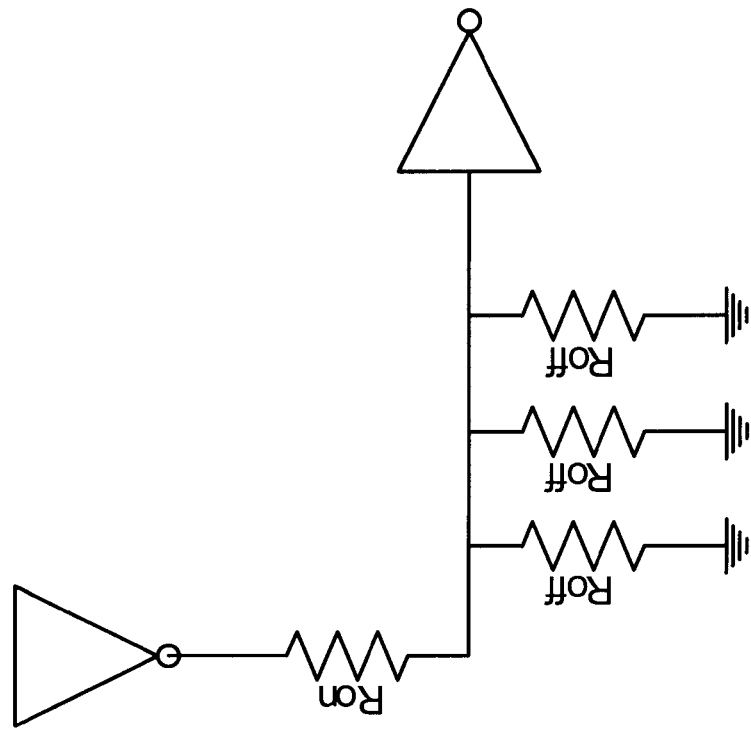
FIGS. 4A and 4B show an exemplary system and equivalent circuit according to an embodiment of the invention.
Figure 4A:
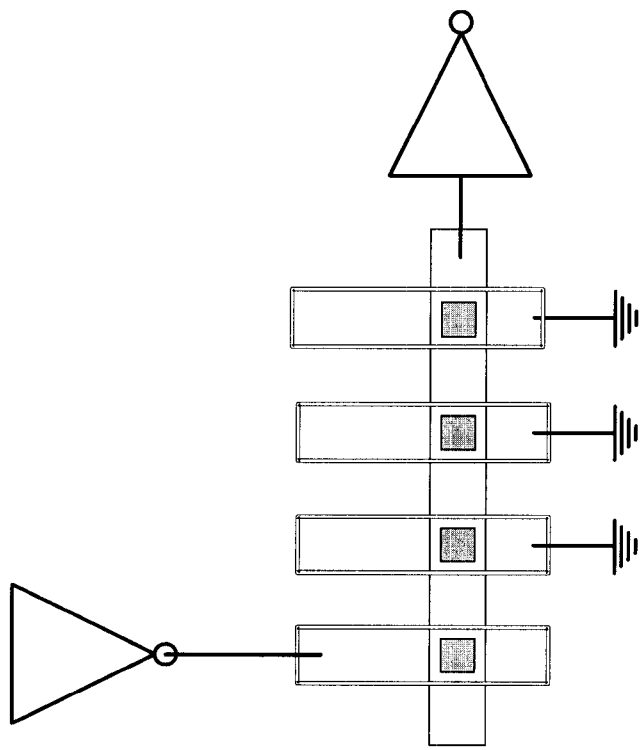

In regard to the first technique, which may be called "segmenting vias," one may begin an analysis by assuming that the resistive phase of a via has a resistance of $R_{off}$ and that the conductive phase has a resistance of $R_{on}$. In this case, the metal layer connected to the programmable vias may be considered as a node in a voltage divider. If a segment has a maximum of Z vias on each segment, then as many as Z−1 vias pulling up (or pulling down) may not overwhelm the signal at the metal segment. FIGS. 4A and 4B illustrate an exemplary equivalent circuit for a single driver pulling high and three "aggressor nodes" pulling low (where the "aggressor nodes" may represent programmable vias in their resistive state connected to other switching signal nets). That is, FIG. 4A shows an exemplary configuration, and FIG. 4B shows an equivalent circuit. If the resulting voltage is still within the noise margin for the receiver, then this circuit will still work.

There are at least two ways, of which the inventors are aware, in which one may accomplish this goal:
(1) One may construct an interconnect architecture, with buffers inserted at points that avoid having any segments that can have too many off resistors;
(2) One may inform the router so that it can segment the wires to avoid signal issues.

Figure 5B:
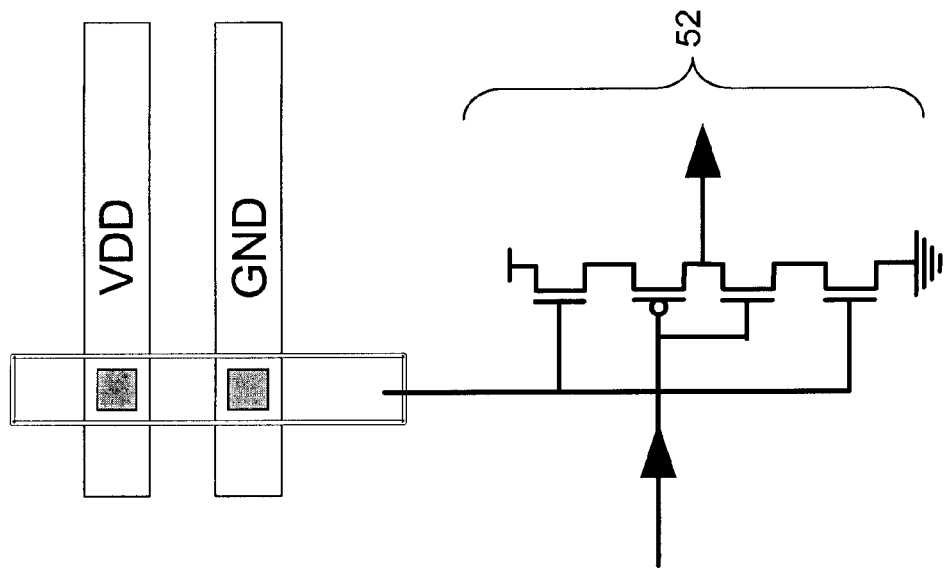
FIGS. 5A and 5B show exemplary techniques that may be used in various embodiments of the invention.
Figure 5A:
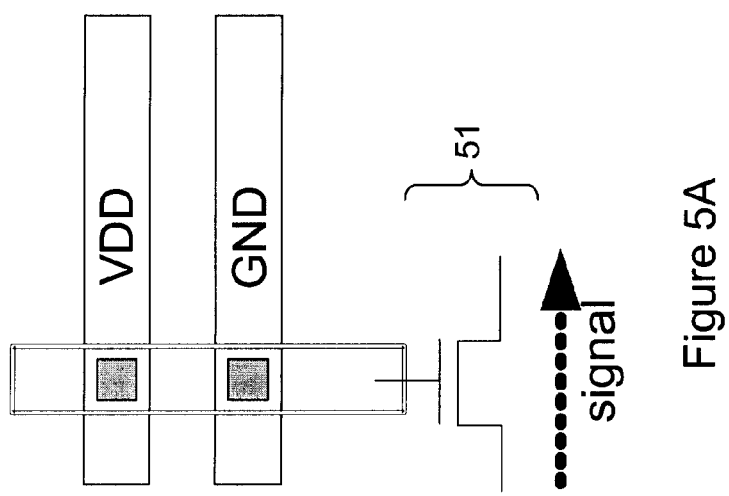

Another approach to dealing with the finite resistance of the off-vias is to use pass transistors or other active circuits to deal with the problem. Examples of two such possibilities are illustrated in FIGS. 5A and 5B. FIG. 5A shows a pair of vias to VDD and GND so that a pass transistor 51 can be used to provide a signal path. FIG. 5B shows a pair of vias to VDD and GND that may allow a tri-state buffer 52 to be either enabled or disabled.

While various of the above embodiments may have been discussed as using phase-change materials to implement programmable vias, such programmable vias may be implemented using other materials. For example, a material whose resistance may be changed between a high-resistance state and a low-resistance state by exposure to heat, light (including infrared, laser, et al.), electricity, and/or a chemical agent may be used to implement programmable vias, and the above principles may be used in conjunction with such materials.

Various embodiments of the invention have now been described in connection with the embedded figures, but the invention is understood to encompass variations and modifications of the above embodiments, as may be apparent to one of ordinary skill in the art.

We claim:

1. A semiconductor device comprising:
a number of metal layers having vias formed among and between them;
a further metal layer overlying an uppermost metal layer of the number of metal layers;
a via layer between the further metal layer and the uppermost metal layer, the via layer comprising one or more programmable vias between one or more segments of the uppermost metal layer and the further metal layer, said one or more programmable vias comprising at least one material having a changeable resistance, wherein the at least one material having a changeable resistance is configured to have its resistance changed by passing an electric signal through the at least one material and at least one pass transistor or at least one tri-state buffer coupled to a metal segment, the metal segment having high-resistance-state vias coupled to power and to ground, wherein the at least one pass transistor or at least one tri-state buffer is configured to mitigate at least one negative effect of finite resistance of one or more of the programmable vias when one or more of the one or more programmable vias is in a high-resistance state.

2. The semiconductor device according to claim 1, further comprising:
a first shift register to address said programmable vias; and
a second shift register to address said programmable vias, wherein the first and second shift registers are to be programmed with data to specify a set of said programmable vias.

3. The semiconductor device according to claim 2, further comprising:
one or more transistors, each coupled to either the first shift register or the second shift register, to provide electric current across one or more of said set of said programmable vias.

4. A semiconductor device comprising:
a number of metal layers having vias formed among and between them;
a further metal layer overlying an uppermost metal layer of the number of metal layers;
a via layer between the further metal layer and the uppermost metal layer, the via layer comprising one or more programmable vias between one or more segments of the uppermost metal layer and the further metal layer, said one or more programmable vias comprising at least one material having a changeable resistance, wherein the at least one material having a changeable resistance is configured to have its resistance changed by exposure to multiple focused laser beams and at least one pass transistor or at least one tri-state buffer coupled to a metal segment, the metal segment having high-resistance-state vias coupled to power and to ground, wherein the at least one pass transistor or at least one tri-state buffer is configured to mitigate at least one negative effect of finite resistance of one or more of the programmable vias when one or more of the one or more programmable vias is in a high-resistance state.

5. The semiconductor device according to claim 1, further comprising:
one or more buffers inserted at one or more points to limit a number of vias in high-resistance states that are connected to a particular metal segment.

6. A semiconductor device comprising:
a number of metal layers having vias formed among and between them;
a further metal layer overlying an uppermost metal layer of the number of metal layers;
a via layer between the further metal layer and the uppermost metal layer, the via layer comprising one or more programmable vias between one or more segments of the uppermost metal layer and the further metal layer, said one or more programmable vias comprising at least one material having a changeable resistance; and
at least one pass transistor or at least one tri-state buffer coupled to a metal segment, the metal segment having high-resistance-state vias coupled to power and to ground, wherein the at least one pass transistor or at least one tri-state buffer is configured to mitigate at least one negative effect of finite resistance of one or more of the programmable vias when one or more of the one or more programmable vias is in a high-resistance state.

7. A method of fabricating a semiconductor device, the method comprising:
forming a number of metal layers having vias formed among and between them;
forming a via layer on top of an uppermost one of the number of metal layers, said via layer being formed using at least one material having a changeable resistance;
forming a further metal layer on top of said via layer, wherein said via layer is adapted to provide at least one programmable via between said uppermost metal layer and said further metal layer, wherein the at least one material having a changeable resistance is configured to have its resistance changed by passing an electric signal through the at least one material and forming at least one pass transistor or at least one tri-state buffer coupled to a metal segment, the metal segment having high-resistance-state vias coupled to power and to ground, wherein the at least one pass transistor or at least one tri-state buffer is configured to mitigate at least one negative effect of finite resistance of one or more of the programmable vias when one or more of the one or more programmable vias is in a high-resistance state.

8. A method of fabricating a semiconductor device; the method comprising:
forming a number of metal layers having vias formed among and between them;
forming a via layer on top of an uppermost one of the number of metal layers, said via layer being formed using at least one material having a changeable resistance;
forming a further metal layer on top of said via layer, wherein said via layer is adapted to provide at least one programmable via between said uppermost metal layer and said further metal layer, wherein the at least one material having a changeable resistance is configured to have its resistance changed by exposure to multiple focused laser beams and forming at least one pass transistor or at least one tri-state buffer coupled to a metal segment, the metal segment having high-resistance-state vias coupled to power and to ground, wherein the at least one pass transistor or at least one tri-state buffer is configured to mitigate at least one negative effect of finite resistance of one or more of the programmable vias when one or more of the one or more programmable vias is in a high-resistance state.

9. The method according to claim 7, further comprising:
forming at least a first shift register and a second register coupled to said via layer to enable programming of one or more vias of said via layer.

10. The method according to claim 9, further comprising:
forming one or more transistors, each coupled to either the first shift register, or the second shift register and also coupled to a via of said via layer.

11. The method according to claim 7, further comprising:
forming one or more buffers at one or more points, the points located in said uppermost metal layer, said further metal layer, or both, to limit a number of vias in high-resistance states that are connected to a particular metal segment.

12. A method of fabricating a semiconductor device, the method comprising:
forming a number of metal layers having vias formed among and between them;
forming a via layer on top of an uppermost one of the number of metal layers, said via layer being formed using at least one material having a changeable resistance;
forming a further metal layer on top of said via layer, wherein said via layer is adapted to provide at least one programmable via between said uppermost metal layer and said further metal layer; and
forming at least one pass transistor or at least one tri-state buffer coupled to a metal segment, the metal segment having high-resistance-state vias coupled to power and to ground, wherein the at least one pass transistor or at least one tri-state buffer is configured to mitigate at least one negative effect of finite resistance of one or more of the programmable vias when one or more of the one or more programmable vias is in a high-resistance state.

13. A method of using a programmable semiconductor device, the semiconductor device including a number of metal layers having interconnections among and between them, a via layer including at least one programmable via formed from at least one material having a changeable resistance and being formed atop an uppermost one of the number of metal layers, and a further metal layer on top of said programmable via layer, and at least one pass transistor or at least one tri-state buffer coupled to a metal segment, the metal segment having high-resistance-state vias coupled to power and to ground, wherein the at least one pass transistor or at least one tri-state buffer is configured to mitigate at least one negative effect of finite resistance of one or more of the programmable vias when one or more of the one or more programmable vias is in a high-resistance state, the method comprising:
programming said at least one programmable via of said via layer to selectively form at least one connection between segments of said uppermost metal layer and said further metal layer or to electrically isolate at least one segment of said uppermost metal layer and at least one segment of said further metal layer, wherein said programming comprises passing an electric signal through at least one programmable via of said via layer to change its resistance.

14. The method according to claim 13, wherein said programming further comprises:
changing a temperature of at least one programmable via of said via layer.

15. A method of using a programmable semiconductor device, the semiconductor device including a number of metal layers having interconnections among and between them, a via layer including at least one programmable via formed from at least one material having a changeable resistance and being formed atop an uppermost one of the number of metal layers, and a further metal layer on top of said programmable via layer, and at least one pass transistor or at least one tri-state buffer coupled to a metal segment, the metal segment having high-resistance-state vias coupled to power and to ground, wherein the at least one pass transistor or at least one tri-state buffer is configured to mitigate at least one negative effect of finite resistance of one or more of the programmable vias when one or more of the one or more programmable vias is in a high-resistance state, the method comprising:
programming said at least one programmable via of said via layer to selectively form at least one connection between segments of said uppermost metal layer and said further metal layer or to electrically isolate at least one segment of said uppermost metal layer and at least one segment of said further metal layer, wherein said programming comprises exposing at least one programmable via of said via layer to a laser beam to change its resistance, wherein said exposing comprises using multiple focused beams to provide energy to a particular via location.

* * * * *